United States Patent [19]

Ljungberg et al.

[11] Patent Number: 5,674,564
[45] Date of Patent: Oct. 7, 1997

[54] ALUMINA-COATED SINTERED BODY

[75] Inventors: Bjorn Ljungberg, Enskede; Mats Sjostrand, Kista; Jan Lindstrom, Lidingo, all of Sweden

[73] Assignee: Sandvik AB, Sandviken, Sweden

[21] Appl. No.: 452,853

[22] Filed: May 30, 1995

Related U.S. Application Data

[62] Division of Ser. No. 238,341, May 2, 1994, abandoned, which is a continuation of Ser. No. 902,721, Jun. 23, 1992, abandoned.

[30] Foreign Application Priority Data

Jun. 25, 1991 [SE] Sweden .................... 9101953

[51] Int. Cl.$^6$ ............................................ C23C 16/40
[52] U.S. Cl. ........................... 427/255.2; 427/255.3; 427/255.7
[58] Field of Search .................... 427/126.4, 253, 427/255.3, 255, 255.2, 255.7, 249

[56] References Cited

U.S. PATENT DOCUMENTS

| | | | |
|---|---|---|---|
| 3,736,107 | 5/1973 | Hale | 428/131 |
| 3,836,392 | 9/1974 | Lux et al. | 148/6.3 |
| 3,837,896 | 9/1974 | Lindstrom et al. | 428/336 |
| 4,180,400 | 12/1979 | Smith et al. | 428/469 |
| 4,576,836 | 3/1986 | Colmet et al. | 427/255 |
| 4,599,281 | 7/1986 | Schintlmeister et al. | 428/699 |
| 4,619,866 | 10/1986 | Smith et al. | 428/336 |
| 5,071,696 | 12/1991 | Chatfield et al. | 428/220 |
| 5,137,774 | 8/1992 | Ruppi | 428/216 |
| 5,352,494 | 10/1994 | Rousseau | 427/562 |

FOREIGN PATENT DOCUMENTS

| | | |
|---|---|---|
| 52-133782 | 9/1984 | Japan . |
| 1389140 | 4/1975 | United Kingdom . |
| 2048960 | 12/1980 | United Kingdom . |

OTHER PUBLICATIONS

Patent Abstracts of Japan, abstract of JP 1-83662, published Mar. 29, 1989.

V.J. Silvestri et al, "Properties of $Al_2O_3$ Films Deposited from the $AlCl_3$, $CO_2$ and $H_2$ System", Journal of the Electrochemical Society, vol. 125, No. 6, 1 Jun. 1978, pp. 902–907.

*Primary Examiner*—Michael Lusignan
*Assistant Examiner*—Timothy H. Meeks
*Attorney, Agent, or Firm*—Burns, Doane, Swecker & Mathis, L.L.P.

[57] ABSTRACT

A sintered hard material body is at least partly coated with at least one 0.5–20 µm wear resistant ceramic oxide coating being <80% thicker in the edges than on the flat surfaces. The oxide coating exhibits a grain size ($\emptyset$) in µm for which:

$$\emptyset \leq kx + a$$

where x is coating thickness in µm on at least 80% of the flat surface of the body, k=0.5, preferably 0.3, and a=2 µm for $4 \leq x < 20$ and a=0 for $0.5 < x < 4$.

The oxide coating is achieved by using a deposition process in which the body is in contact with a gas containing one or more halides of a metal or metals and a hydrolyzing and/or oxidizing agent forming the metal oxides and with an additional reactant (dopant) of sulphur, phosphorus, selenium, tellurium, arsenic, antimony and/or bismuth and/or compounds thereof. The temperature during deposition is in the range of 800°–1000° C., preferably 850°–970° C., and the volume concentration of the additional reactant is 0.25–3%, preferably 0.3–1%, of the total gas volume.

15 Claims, No Drawings

ALUMINA-COATED SINTERED BODY

This application is a divisional, of application Ser. No. 08/238,341, filed May 2, 1994, now abandoned, which is a continuation of application Ser. No. 07/902,721, filed Jun. 23, 1992, now abandoned.

BACKGROUND OF THE INVENTION

The present invention relates to a sintered body of cemented carbide or similar material coated with at least one thin, wear resistant, extremely fine-grained surface layer of ceramic oxides, preferably aluminum oxide (alumina) and method of manufacturing the same.

It is well-known that for, e.g., a cemented carbide cutting tool insert used in metal machining, the wear resistance can be considerably increased by applying hard surface layers of metal oxides, carbides or nitrides with the metal either selected from the transition metals of the groups IV, V and VI of the Periodic Table or from silicon, boron and aluminum. The coating thickness usually varies between 0.1–20 µm and the most common technique for depositing such coatings is CVD (Chemical Vapor Deposition).

It is also known that further improvements of the performance of a cutting tool can be achieved if a plurality of coating combinations with double, triple or multilayer structures is deposited on the substrate. A substantial improvement of the wear resistance is obtained if a layer of aluminum oxide, $Al_2O_3$, or zirconium oxide, $ZrO_2$, is incorporated in the layer structure or if it is deposited on top of layers of metal carbides, nitrides, oxides and borides or combinations thereof with the metal atoms chosen from Ti, Zr, Hf, V, Nb, Ta, Cr, Mo, W, Si and where applicable, B.

The first $Al_2O_3$ coating patents (U.S. Pat. Nos. 3,836,392 and 3,736,107) were mainly concerned with the deposition of $Al_2O_3$ directly onto cemented carbide bodies without using intermediate deposited coatings of, e.g., TiC, TiN or TiCON. The use of intermediate deposited coatings, between the cemented carbide body and the outer alumina coating, was first suggested in U.S. Pat. No. 3,837,896.

Alumina, $Al_2O_3$, crystallizes in several different polymorphs. The two most often occurring polymorphs in CVD coatings deposited onto cemented carbides at standard CVD temperatures, 1000°–1050° C., are the stable α and the metastable κ phases. The α phase generally appears on cemented carbide surfaces or, e.g., on an underlying TiC-coating, as coarse, protruding grains or as clusters of coarse grains with a diameter of 10–100 µm, whereas the metastable κ phase is more fine-grained with a grain size approximately ranging from 3 to 6 µm depending on the total alumina coating thickness. The alumina coating generally consists of 5–95 % α phase. Quite often cracks appear in and around the α phase grains or clusters. The protruding, large α grains have a higher tendency to spall off the cutting tool substrate than the finer κ grains during a cutting operation. This bimodal grain structure also results in an uneven surface topography causing a variation in optical appearance as well as in cutting performance.

An improvement of the surface topography can be obtained if the $Al_2O_3$ growth process is repeatedly interrupted by, e.g., a very short TiC or TiN process step in accordance with the previously known techniques (Great Britain Patents 1,389,140 and 2,048,960, U.S. Pat. No. 4,599,281 and Japanese Patent 52-133782). This multi-sandwich-technique causes a grain refinement in the alumina coating. However, this structure often shows limited internal adhesion between the individual alumina sublayers.

In U.S. Pat. No. 4,180,400, a method of controlling and producing alumina coatings consisting of at least 85% of the metastable κ phase is described. This method, however, does not allow for an enhancement of the growth rate of the coating.

In the development of CVD processes of $Al_2O_3$, there is a desire to find means for producing well-adherent, topographically smooth and fine-grained coatings of sufficient thickness for wear purposes. Further requirement of the coating are: satisfactory cohesion with a minimum of defects, porosity and cracks, even coating thickness around the entire substrate, corners, edges and plane surfaces.

U.S. Pat. No. 4,619,866 describes a method for producing fast growing $Al_2O_3$ layers by utilizing a hydrolysis reaction of a metal halide under the influence of a dopant, e.g., hydrogen sulfide ($H_2S$) in the concentration range 0.01–0.2% (as given in the patent examples) at a CVD deposition temperature 1000°–1050° C. (as given in the patent examples) although broader ranges are disclosed. Under these process conditions as used and exemplified, essentially two phases of $Al_2O_3$, the α and the κ phases, are produced. The resulting coating consists of a mixture of the smaller κ grains and the larger α grains. The process yields coatings with an even layer thickness distribution around the coated body.

During conventional, thermal CVD of alumina at 1000°–1050° C., both κ-and α-$Al_2O_3$ are nucleated and grown. As described in U.S. Pat. No. 5,071,696, the κ phase is nucleated and grown epitaxially on the substrate layer which is often a TiC or a TiCON type coating. This results in a satisfactory coating adherence. The α-$Al_2O_3$ phase is believed to nucleate on an oxidized substrate surface area, e.g., on $Ti_2O_3$ or $Ti_3O_5$. During the deposition period, these oxides are believed to convert back to the lower oxide TiO or to TiCO and due to the concomitant volume contraction, interfacial pores will be created resulting in a weakened coating adhesion.

Furthermore, it has been shown that during post heat treatment of the coating, and presumably also during the coating period itself, at a temperature of 1000°–1050° C., the metastable κ phase may transform into the a phase as disclosed in U.S. Pat. No. 5,071,696. At lower deposition temperatures, preferably 900°–950° C., this transformation will be very slow. Hence, a lower deposition temperature would thus be one of the necessary conditions for growing and sustaining the fine-grained κ or other fine-grained, metastable $Al_2O_3$ phases during the entire deposition period.

A lower deposition temperature also decreases the rate of potential surface oxidation leading to α nucleation.

Up to this date, there has not been reported any reliable method for successfully depositing hard, adherent, high-quality alumina coatings in the desired low-temperature region, e.g., below 1000° C. and, in particular, below 950° C. When deposition of alumina is carried out by known methods below 950° C., only very thin, powdery deposits are obtained.

A low process temperature during the alumina deposition has been mentioned in previous patents but only in connection with very thin coatings and while utilizing very different CVD processes, e.g., with Al-metallo-organic compounds as reactants, or, e.g., with $H_2O$ as the oxygen source as disclosed in U.S. Pat. No. 3,836,392. This type of process is not being used for commercial coating of cemented carbides.

OBJECTS OF THE INVENTION

It is an object of this invention to avoid or alleviate the problems of the prior art.

It is also an object of this invention to provide an improved alumina coated sintered body.

In one aspect of the invention there is provided a sintered hard material body comprising a base body of a sintered hard material at least partly coated with at least one wear resistant ceramic oxide coating having a thickness of from 0.5–20 μm, said coating being <80% thicker in the edges than on the flat surfaces, said oxide coating having a grain size (φ) in μm for which:

$$\phi \leq kx + a$$

where x is coating thickness in μm on at least 80% of the flat surfaces of the body, k=0.5, and a=2 μm for 4≦x <20 and a=0 for 0.5<x <4.

In another aspect of the invention there is provided a method of at least partly coating a sintered hard material body with at least one 0.5–20 μm wear resistant ceramic oxide coating being <80% thicker in the edges than on the flat surfaces by a deposition process in which said body is in contact with a gas containing one or more halides of a metal or metals and a hydrolyzing and/or oxidizing agent forming the metal oxides and with an additional reactant (dopant) of sulphur, phosphorus, selenium, tellurium, arsenic, antimony and/or bismuth and/or compounds thereof, the coating process conditions including a temperature during deposition of from 800°–1000° C., and a volume concentration of said additional reactant of 0.25–3% of the total gas volume.

DETAILED DESCRIPTION OF THE PREFERRED EMBODIMENTS OF THE INVENTION

According to the present invention there is now provided a method for depositing and producing high quality, well-adherent thin (0.5–4 μm), or preferably thick (4–20 μm) ceramic oxide coatings with a high growth rate. The coatings have an evenly distributed layer thickness around the entire coated body being <80%, preferably <30%, thicker in the edges than on the flat surfaces and a smooth coating surface and fine grain size. The deposition process temperature can range from 800° to 1000° C., preferably 850° to 970° C., most preferably from 900° to 950° C. During the deposition process, said body is in contact with a gas containing one or more halides of a metal or metals and a hydrolyzing and/or oxidizing agent forming the metal oxides and with an additional reactant (dopant) with a concentration of 0.25–3%, preferably 0.3–1%, most preferably 0.4–0.8%, of the total gas volume being used during the CVD process. The additional reactant is preferably sulphur and/or phosphorus or a compound of these but can equally well be selenium, tellurium, arsenic, antimony or bismuth or compounds and/or mixtures of all these reactants. Examples of such reactants or dopants are hydrogen sulfide ($H_2S$), phosphorus chloride ($PCl_3$), carbon oxysulfide (COS) and phosphine ($PH_3$). Preferably hydrogen sulfide is used.

Hence, by the use of higher concentration of the additional dopant (reactant) in combination with lower process temperature than were actually employed in U.S. Pat. No. 4,619,866, a smooth, high quality, well-adherent ceramic oxide coating can be successfully grown. Furthermore, the grain-size of the coating can be controlled by carefully varying the dopant concentration and/or the temperature during the nucleation step and during the subsequent growth period.

Preferably, the ceramic oxide is $Al_2O_3$ and/or $ZrO_2$. Most preferably, the ceramic oxide is $Al_2O_3$ consisting essentially, preferably, of more than 85%, of the κ phase or other her metastable modification. The κ-to-α ratio can be controlled in the same way as the grain size as indicated above.

If coatings less than 4 μm in thickness are produced according to the present invention, still finer-grained coatings will result as compared to coatings produced by prior an CVD processes. The grain size φ in μm, can be expressed as follows:

$$\phi \leq kx$$

where x is coating thickness in μm on at least 80% of the flat surface of the body and k=0.5, preferably 0.3, and most preferably 0.15.

In the lower temperature region, 850°–950° C., and with a fairly high volume concentration of dopant (0.5–2%) in the process gas, thick (4–10 μm), fine-grained, preferably <2 μm, 100% κ $Al_2O_3$ coatings can readily be grown. The grains size φ in μm, can be expressed as follows:

$$\phi \leq kx + 2$$

where x is coating thickness in μm on at least 80% of the flat surfaces of the body and k=0.5, preferably 0.3, most preferably 0.15.

Within the fine-grained coating according to this invention, occasionally some larger grains can be present. In some cases these large grains may cover up to 10% of the coated surface. The growth of these large grains may be caused by impurities or dust particles that occasionally are present in the CVD process gas. The larger grains may also originate from oxidized micro-spots on the underlying surface as was discussed previously.

In accordance with known techniques, a coating according to the present invention can be used as a single coating or be deposited on, e.g., TiC or TiCON intermediate layers. Further coatings can be deposited on top of the ceramic oxide coating, e.g., TiN and the oxide coating of the present invention can be used within a multi-coating structure.

Preferably, an innermost layer with a thickness of 0.5–10 μm and comprising at least one member selected from the group consisting of the carbides, nitrides, carbonitrides and oxycarbonitrides of Ti, Zr, Hf, V, Nb, Ta, Cr, Mo, W or B is used.

The products produced according to the present invention include inserts for cutting tools made of cemented carbides, cermets or ceramics. Furthermore, end mills, drills, reamers, broaches and in general, wear parts made of steel, high speed steel, cemented carbide, cermets and ceramics.

When fine-grained $Al_2O_3$ coated cemented carbide cutting tools according to the invention are used in metal machining, several important improvements have been observed:

1) The absence of coarser grains improves the flaking resistance of the tool and also the abrasive wear resistance.

2) The fine-grained κ alumina layer is less sensitive to chip hammering on the tool surface. See Example 1.

3) A fine-grained, smooth alumina coating makes it easier to stay within closer dimensional tolerances of the cutting tool.

The invention is additionally illustrated in connection with the following Examples which are to be considered as illustrative of the present invention. It should be understood, however, that the invention is not limited to the specific details of the Examples.

EXAMPLE 1

An alumina coating with an intermediate layer of TiC was deposited on cemented carbide inserts in a reactor, the essential parts of which were made of Inconel. In this reactor, 3000 sintered cemented carbide inserts were heated to 1000° C. The inserts to be coated were of different grades, among them inserts containing 5.5% Co, 2.6% TiC, 6.2% TaC/NbC and balance WC. The inserts were placed on precoated metal nets providing good contact with the surrounding process gas, which consisted of a mixture of 6% $TiCl_4$, 5% $CH_4$ and 89% $H_2$ by volume (Run No. 1). The pressure in reactor was maintained at 5 kPa. The linear gas velocity in the batch of inserts was 1 m/sec. The inserts were treated for 6 hours. As a result of the treatment, a fine-grained TiC layer of about 6 μm thickness was obtained.

In a separate deposition run, 3000 inserts of a different grade containing 8% Co and balance WC, were coated with TiCN and TiN, 1 μm of each compound, in a sequence according to known technique (Run No. 2). $N_2$ gas was used as the nitrogen source.

Half the mount of the inserts (1500 +1500) from the two deposition runs described above were treated in an apparatus nearly identical to the one described above. A reaction gas with the composition 5% $CO_2$, 3% $AlCl_3$, 0.4% $H_2S$, 2% HCl and balance $H_2$ were supplied. The gases were introduced successively during a time span of 2 hours, $H_2S$ being the last gas introduced. The temperature in the reactor was 940° C. and the pressure 5 kPa. The linear gas velocity in the reactor batch was 3 m/sec. After a deposition time of 7 hours, a 4–5 μm thick layer of $Al_2O_3$ was formed on the TiC or TiCN/TiN coated inserts.

The remaining 3000 inserts from runs 1 and 2 were coated with $Al_2O_3$ according to prior art, i.e., at a reactor batch temperature of 1050° C. and using only 0.1% $H_2S$. All other conditions remained the same. A 4–5 μm coating thickness was obtained, but coarse grained areas covered at least 20% of the total area of the inserts.

Inserts produced according to the present invention had fine grains of $Al_2O_3$ in the coating, with occasional inclusions of very oblong fine grains believed to contain Ti—Al—C phases.

A continuous turning test in east iron, SIS 0125 (composition C=3.4%, Si=1.5%, Mn—0.7%) with hardness FIB=220 was performed with the following data:

Cutting speed: 200 m/min
Feed: 0.3 mm/rev
Depth of cut: 2 mm
Insert style: SPUN 120308

The tool life, measured according to current standards, was estimated as follows:

| Grade Corresponding to | | Tool life, minutes |
|---|---|---|
| 1 | 5.5% Co, uncoated | 8 |
| 2 | 5.5% Co, TiC (5 μm) only | 23 |
| 3 | 5.5% Co, TiC + $Al_2O_3$; prior art $Al_2O_3$ (6 μm + 4.5 μm) | 55 |
| 4 | 5.5% Co, TiC + $Al_2O_3$; present invention (6 μm + 4.5 μm) 950° C. and 0.4% $H_2S$ | 65 |

From these results, it is evident that the insert produced according to the present invention gives a superior tool life as compared to the other coated inserts. In another intermittent cutting test, especially designed to access the flaking tendency on the edge line of the cutting tool when being used in machining of nodular cast iron, the inserts with alumina coatings corresponding to No. 3 and 4 in the above table, but with TiCN/TiN as intermediate coatings were tested. It could readily be seen that the insert according to the invention, No. 4, was much less worn than the prior an insert, No. 3.

EXAMPLE 2

(Run No. 1) Commercial cemented carbide inserts of composition 5.5% Co, 2.6% TiC, 6.2% TaC/NbC and balance WC were coated in a reactor similar to the one described in Example 1. However, this reactor could be loaded with a significantly larger amount of inserts (up to 16000 inserts).

The inserts were sequentially coated with TiC (1 μm), TiCN (4 μm) and $Al_2O_3$ (6 μm). For the TiC process, a gas composition of 4% $TiCl_4$ and 6% $CH_4$ was used at 1030° C. and for the TiCN process, a gas composition of 4% $TiCl_4$, 6% $CH_4$ and 15% $N_2$ at 1030° C. was used. Prior to the $Al_2O_3$ deposition start, the process temperature was reduced to 960° C. $Al_2O_3$ was then deposited for 8 hours with a reaction gas containing 5% $CO_2$, 3% $AlCl_3$ and 0.4% $H_2S$.

(Run No. 2) The TiC and TiCN depositions were identical to those in Run No. 1. Prior to the $Al_2O_3$ deposition start, the temperature was increased to 1040° C. and $Al_2O_3$ was deposited for 5.5 hours with a gas composition of 5% $CO_2$, 3% $AlCl_3$ and 0.25% $H_2S$.

The metallurgical investigation showed that inserts from Run No. 1 exhibit a smooth, fine-grained $Al_2O_3$ coating of 100% κ phase (according to XRD), whereas inserts from Run No. 2 had a mixed grain structure, both large grains and smaller grains. XRD shows 100% a phase.

Tool inserts from Runs No. 1 and No. 2 were compared in a cutting operation machining ball bearing rings in which severe chip hammering of the tool surface occurs. The following results were obtained:

| Inserts from Run. No. | Produced pieces of ball bearing rings | Tool failure criterium |
|---|---|---|
| 1 | 66 | worn out |
| 2 | 5 | edge breakage |

It is presumably the inherent cracks and porosity in the α $Al_2O_3$ coating obtained in Run. No. 2 that are responsible for the early breakage of the cutting edge and the reduced tool life observed in the test.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of at least partly coating a sintered hard material body with a 0.5 to 20 μm thick layer of a wear resistant alumina-containing layer including over 85% kappa $Al_2O_3$ which is <80% thicker in edges than on a flat surface of the body by a deposition process comprising:

coating at least pan of the body with the alumina-containing layer by contacting the body with a gas consisting essentially of an aluminum halide, a hydrolyzing, oxidizing or hydrolyzing and oxidizing agent, and an additional reactant selected from the group consisting of sulfur, phosphorus, selenium, tellurium, arsenic, antimony, bismuth, and compounds thereof, the coating being performed at a deposition temperature of from 800° to 970° C. and a volume concentration of the additional reactant being 0.40 to 3% of the total gas volume.

2. The method of claim 1, wherein the additional reactant is hydrogen sulfide.

3. The method of claim 1, wherein the deposition temperature is 870°–930° C. and the volume concentration of the additional reactant is 1.2%–2%.

4. The method of claim 1, wherein the alumina-containing layer includes over 90% kappa $Al_2O_3$ and has a grain size ($\phi$) in µm for which:

$$\phi \leq 0.3x + a$$

where x is the coating thickness in µm and x=0.5 to 20 µm a=2 for 4<x ≤20 µm a=0 for 0.5≤x≤4 µm.

5. The method of claim 1, further comprising coating the body with an innermost layer between the alumina-containing layer and the body, the innermost layer having a thickness of 0.5 to 10 µm and comprising at least one member selected from the group consisting of carbides, nitrides, carbonitrides and oxycarbonitrides of Ti, Zr, Hf, V, Nb, Ta, Cr, Mo, W and B.

6. The method of claim 1, wherein the alumina-containing layer is at least 4 µm thick.

7. The method of claim 1, wherein the alumina-containing layer is <30% thicker in the edges than on the flat surface.

8. The method of claim 1, wherein the alumina-containing layer consists essentially of 100% kappa-$Al_2O_3$.

9. The method of claim 1, wherein the volume concentration of the additional reactant is 0.4 to 0.8% of the total gas volume.

10. The method of claim 1, wherein the deposition temperature is 850° to 970° C.

11. The method of claim 1, wherein the deposition temperature is 850° to 970° C. and the volume concentration of the additional reactant is 0.4–0.8%.

12. The method of claim 1, wherein the gas consists of $CO_2$, $AlCl_3$, $H_2S$, HCl and $H_2$.

13. The method of claim 1, wherein the gas consists of $CO_2$, $AlCl_3$, $H_2S$ and $H_2$.

14. The method of claim 1, wherein the aluminum halide, the oxidizing agent and the additional reactant are successively introduced into a reactor containing the body.

15. The method of claim 1, wherein the gas consists of 5% $CO_2$, 3% $AlCl_3$, 0.4% $H_2S$, balance $H_2$.

* * * * *